United States Patent
Malherbe et al.

(10) Patent No.: US 6,818,953 B2
(45) Date of Patent: Nov. 16, 2004

(54) PROTECTION OF AN INTEGRATED CIRCUIT AGAINST ELECTROSTATIC DISCHARGES AND OTHER OVERVOLTAGES

(75) Inventors: Alexandre Malherbe, Trets (FR); Fabrice Blisson, Aix en Provence (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/278,434

(22) Filed: Oct. 23, 2002

(65) Prior Publication Data

US 2003/0076640 A1 Apr. 24, 2003

(30) Foreign Application Priority Data

Oct. 23, 2001 (FR) .............................................. 01 13675

(51) Int. Cl.$^7$ .............................................. H01L 23/62
(52) U.S. Cl. .......................... 257/355; 257/357; 361/2; 361/3; 361/5; 361/8; 361/9
(58) Field of Search ............... 261/2–100; 257/355–357

(56) References Cited

U.S. PATENT DOCUMENTS

| 5,079,612 | A |   | 1/1992 | Takamoto et al. |
| 5,237,395 | A |   | 8/1993 | Lee |
| 5,361,185 | A |   | 11/1994 | Yu |
| 5,548,135 | A |   | 8/1996 | Avery |
| 6,141,192 | A | * | 10/2000 | Garzon .......................... 361/5 |
| 6,258,672 | B1 |  | 7/2001 | Shih et al. |

OTHER PUBLICATIONS

French Search Report from French Patent Application No. 01/13675, filed Oct. 23, 2001.

* cited by examiner

Primary Examiner—Fetsum Abraham
(74) Attorney, Agent, or Firm—Lisa K. Jorgenson; James H. Morris; Wolf, Greenfield & Sacks, P.C.

(57) ABSTRACT

The forming of an integrated circuit including at least one element of electronic protection of the circuit formed of at least one switch for short-circuiting supply conductors arranged in a rail, the switch being integrated in the rail, under said conductors.

13 Claims, 2 Drawing Sheets

PROTECTION OF AN INTEGRATED CIRCUIT AGAINST ELECTROSTATIC DISCHARGES AND OTHER OVERVOLTAGES

BACKGROUND OF THE INVENTION

1. Field of the Invention

The present invention relates to the protection of an integrated circuit against electrostatic discharges and other overvoltages. The present invention more specifically relates to the integration of the circuits necessary to such protection.

2. Discussion of the Related Art

Circuits of protection against electrostatic discharges (ESD) aim at protecting an electronic circuit against electrostatic discharges that come from its terminals.

FIG. 1 schematically illustrates a conventional example of an electronic protection circuit 1. The function of this circuit especially is to short-circuit supply lines 2, 3 of the integrated circuit when an overvoltage due to an electrostatic discharge applied on a pad 4 of the circuit occurs. This pad is intended to connect the core of the integrated circuit (not shown) to the outside. Protection circuit 1 includes two diodes D1, D2 in series connecting supply lines 2 and 3. Midpoint 5 of this series connection is electrically connected to pad 4. The biasing of diodes D1 and D2 is such that, in normal operation, they are off. Accordingly, in the example of FIG. 1, line 2 forms the most positive supply line while line 3 forms the most negative supply line (generally, the ground). Circuit 1 also includes a MOS transistor MOSSWI interconnecting supply lines 2 and 3 and having its gate connected to at least one ESD protection control circuit 6.

Disturbances of electrostatic type likely to be received by pads 4 may be formed of positive or negative charges. When such charges appear, one of diodes D1 or D2 becomes conductive. Transistor MOSSWI must then be turned on to short-circuit supply lines 2 and 3 and thus conduct away the excess charges. By passing the charges through transistor MOSSWI, it is avoided for them to damage the core. To ensure that the electric path formed by diode D1 or D2 is less resistive than the passing through the circuit core, a resistor 7 is provided between each pad 4 and the integrated circuit core.

Circuit 6 (CT) thus sets a time constant ($\tau$) of triggering of transistor MOSSWI upon occurrence of an electrostatic discharge, that is, of a current flowing through one of diodes D1 or D2. Circuit 6 is generally formed of a resistive and capacitive circuit (RC cell).

Transistors MOSSWI for short-circuiting the supply conductors may also be used as a protection against possible overvoltages with respect to the maximum value admissible by the integrated circuit technology. In this case, an additional control circuit 8 (OVT) has the function of detecting possible overvoltages (for example, with respect to a predetermined voltage threshold Vref) and of turning on the transistor MOSSWI to which the circuit is associated. The integrated circuit is thus not only protected against electrostatic discharges but also against any overvoltage, whatever its origin.

Reference will be made hereafter to electronic protection circuits to encompass the protection against electrostatic discharges (ESD) and, unless otherwise mentioned, the protection against other overvoltages.

Among the features to be respected by an electronic protection circuit 1, one should note:

the fact that transistor MOSSWI must exhibit the smallest possible on-state resistance (RdsON) to properly fill its protection function and avoid for the overvoltage to propagate to the rest of the circuit. As a result, transistor MOSSWI (generally, an N-channel MOS transistor) has a significant size to be able to rapidly conduct the excess charges.

Control circuit 6 intended to detect the overvoltages must generally have a low time constant (most often smaller than 200 ns).

The foregoing results in that it is generally desired to place the transistor MOSSWI of a protection circuit as close as possible to the pad or to pads 4 that it is supposed to protect. This, to minimize the resistance brought by the actual supply lines and by the sections present between the pads and the transistor terminals.

Further, the control circuit(s) themselves must conventionally be placed as close as possible to transistor MOSSWI, here again, to minimize the resistance due to the conductive path between these circuits and the gate of transistor MOSSWI generally forming the capacitive element of control circuit 6.

FIG. 2 illustrates, in a very simplified partial top view, a conventional example of implementation of an integrated circuit 10 having pads 4 associated with ESD protection circuits. In the example of FIG. 2, three pads 4 (PAD) and two ESD protection circuits 1 have been illustrated. For the proximity reasons discussed hereabove, protection circuits 1 are generally placed in what is called a crown of the integrated circuit. This crown surrounds the circuit core integrating the different functions linked to the specific application of the integrated circuit.

The crown of circuit 10 generally includes what is called a supply rail 11 (BUS) which includes at least two conductors 12, 13 conveying respectively more positive and more negative supply voltages VP and VN of the integrated circuit. If necessary, supply rail 11 may include other conductors, for example, if the integrated circuit has a positive supply voltage, a ground and a negative supply voltage.

The supply bus may be only partial at the periphery or be arranged differently in the integrated circuit (for example, at the center). The notion of core encompasses, whatever its position, the integrated elements performing the different functions linked to the application specific to the integrated circuit and supplied by a bus having any form.

Each transistor MOSSWI of a circuit 1 is connected, respectively by a conductor 14, 15, to conductor 12, 13 of the supply bus. Similarly, each pad 4 is connected to conductors 12 and 13 via diodes (D1, D2, FIG. 1), not shown in FIG. 2.

From the point of view of the connection pads, two large integrated circuit families can generally be distinguished.

A first family includes circuits generally designated as "pad limited" circuits. It gathers the integrated circuits in which the high number of connection pads to the outside from the integrated circuit core conditions the size of the actual integrated circuit due to the perimeter required to align all pads.

A second circuit family includes circuits generally designated as "core limited" circuits, the size of which is limited by the core surface area and not by the perimeter required to align the pads.

In the circuits of the first family, all the room necessary to form, in sufficient numbers, MOSSWI transistors and their control circuits to correctly protect the integrated circuit against electrostatic discharges is available in the integrated circuit core.

However, in circuits having their size already determined by the integrated circuit core, it is prejudicial to the general circuit bulk to have to increase this size of the core to form the MOSSWI transistors of the ESD protection circuits. Typically, the protection circuits may amount to up to 10% of the chip core size, which adversely affects the generally desired miniaturization.

SUMMARY OF THE INVENTION

The present invention aims at providing an integrated circuit with an electronic protection element of reduced bulk.

The present invention more specifically aims at reducing the general bulk of an integrated circuit of core limited type equipped with electronic protection elements.

The present invention also aims at providing a solution which does not adversely affect the quality of the ESD protection or which even improves it.

The present invention also aims at providing a solution which enables protecting the integrated circuit against any type of overvoltage.

The present invention further aims at providing a solution which is compatible with current integrated circuit manufacturing techniques.

To achieve these and other objects, the present invention provides an integrated circuit including at least one element of electronic protection of said circuit formed of at least one switch for short-circuiting supply conductors arranged in a rail, said switch being integrated in said rail, under said conductors.

According to an embodiment of the present invention, several switches are controlled by at least one first common circuit.

According to an embodiment of the present invention, said first circuit detects the occurrence of electrostatic charges.

According to an embodiment of the present invention, the circuit further includes at least one second control circuit detecting the occurrence of overvoltages between said supply conductors.

According to an embodiment of the present invention, the control circuit(s) of the short-circuit switches are located in a core of the integrated circuit.

According to an embodiment of the present invention, the switches are formed of MOS transistors having their respective drains and sources connected to one of two supply conductors of the integrated circuit.

According to an embodiment of the present invention, an additional conductor for controlling the gates of the MOS transistors is provided in the supply rail.

The present invention also provides a method for integrating switches for short-circuiting supply conductors arranged in a rail, comprising forming the switches in the form of MOS transistors under the rail supply conductors.

The foregoing objects, features and advantages of the present invention will be discussed in detail in the following non-limiting description of specific embodiments in connection with the accompanying drawings.

DETAILED DESCRIPTION

Figure 2:
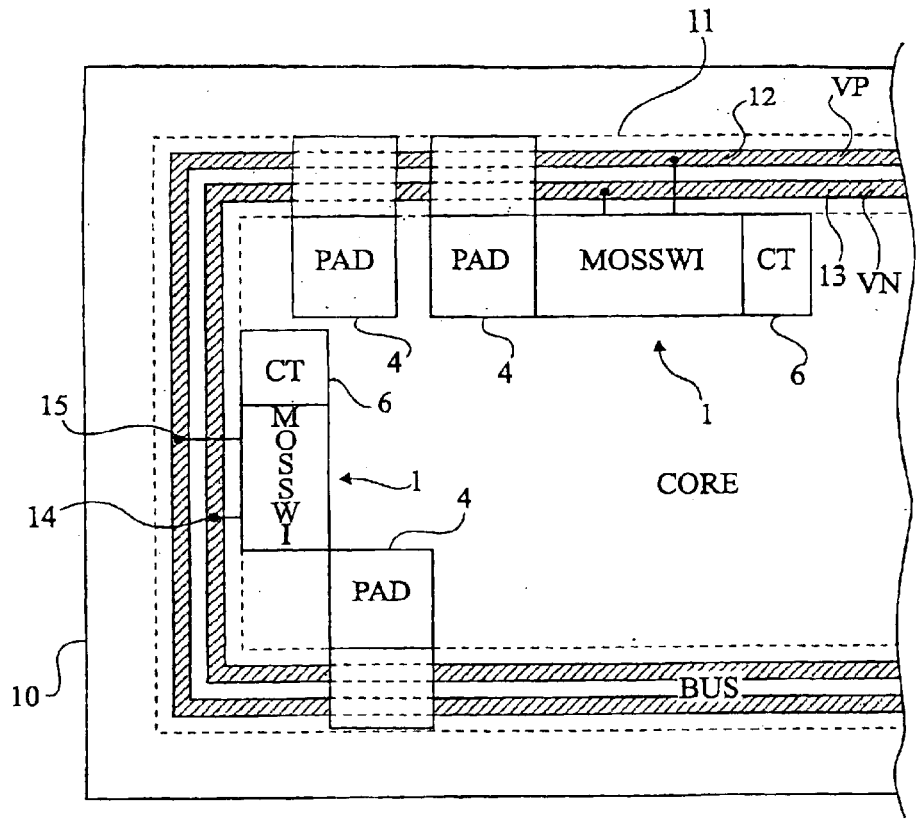
FIG. 2, previously described, illustrates an example of a conventional arrangement of circuits of protection against overvoltages in an integrated circuit.
Figure 1:
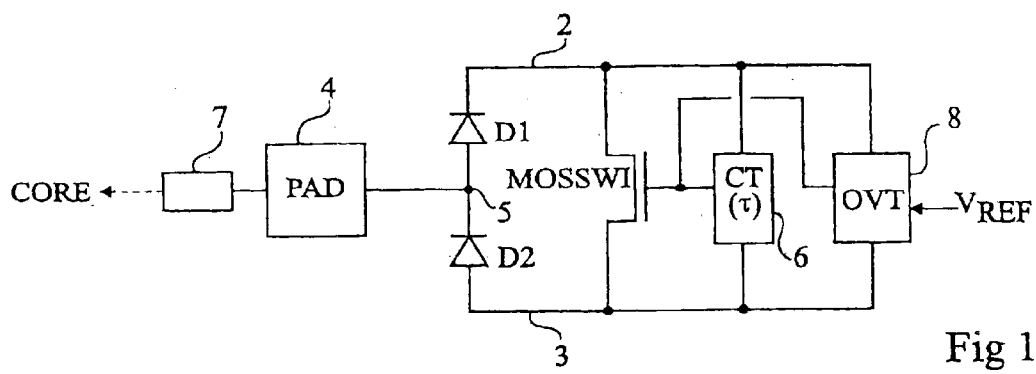
FIG. 1, previously described, shows the electric diagram of a circuit of protection against electrostatic discharges and other overvoltages.

Same elements have been designated with same references in the different drawings. For clarity, only those elements useful to the understanding of the present invention have been shown in the drawings and will be described hereafter. In particular, the application function of the integrated circuit has not been detailed. The invention applies whatever the application of the integrated circuit.

A feature of the present invention is to take advantage of the silicon surface present under the supply rail of an integrated circuit to integrate therein the MOSSWI transistors of its elements of electronic protection (against electrostatic discharges and/or overvoltages).

To save room, it could have been devised to integrate under the supply rail core elements specific to the integrated circuit application. However, such a solution would have appeared to be unsatisfactory since the connection of the core circuits of the application would have required metallization levels to form the interconnections. Now, in the supply rail, all metallizations levels are most often used to form the actual supply conductors (12, 13, FIG. 2) to increase their thickness to reduce the width of the supply rail and thus the circuit bulk.

The present invention takes advantage of the fact that the forming of the switches (MOSSWI) of the electronic protection elements (especially ESD) and their connection only require the positive and negative supply signals and a control signal. Now, the supply conductors are already present in the rail, and thus above the silicon surface in which the present invention provides integrating the MOSSWI transistors.

Figure 3:
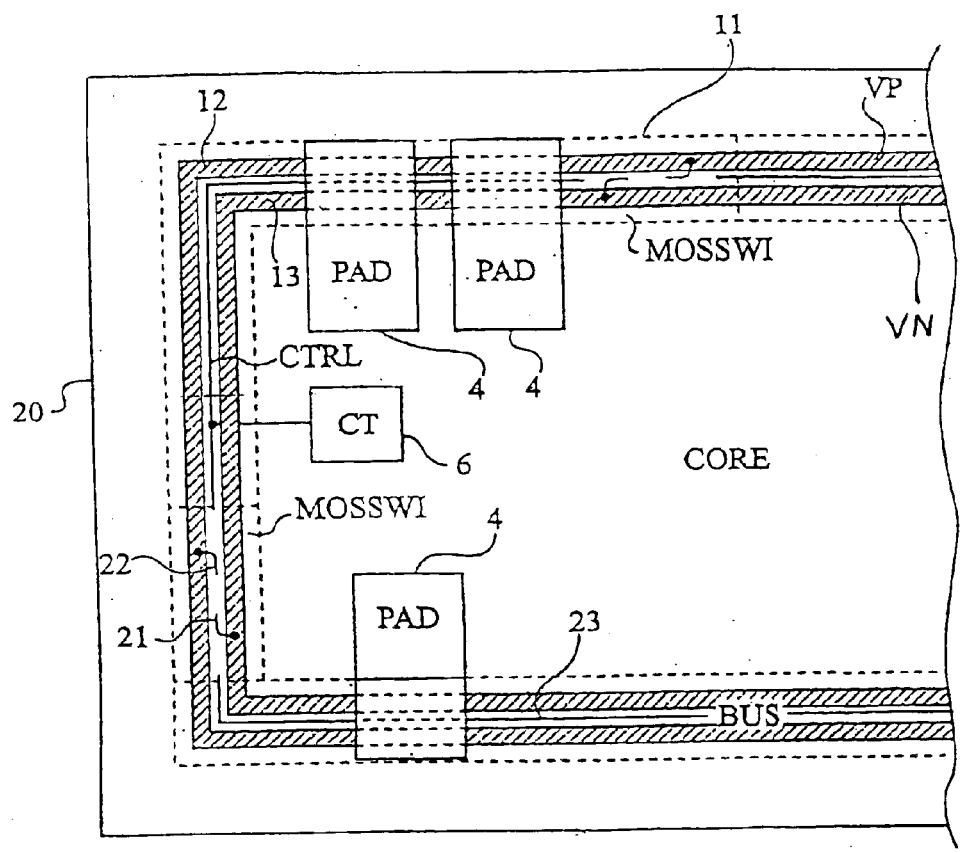
FIG. 3 shows, in a very simplified top view, an arrangement mode of electronic protection circuits according to the present invention.

FIG. 3 illustrates, in a very simplified top view to be compared to that of FIG. 2, an embodiment of an integrated circuit 20 according to the present invention.

It includes pads 4 of connection of the core of integrated circuit 20 to the outside, as well as a supply rail 11 (in this example, peripheral) including a conductor 12 conveying a more positive supply voltage VP and a conductor 13 conveying a relatively more negative supply voltage VN (generally, the ground).

According to the present invention, the MOSSWI transistors of the electronic protection circuits (ESD and/or overvoltage) are arranged in supply rail 11, under conductors 12 and 13. The connections of the MOSSWI transistors to conductors 12 and 13 have been symbolized in FIG. 3 by connections 21 and 22 which are to be compared to connections 14 and 15 of FIG. 2. The control of the MOSSWI transistors of the circuit of the present invention is provided by a conductor 23 conveying control signal CTRL provided by a control circuit 6 (CT) formed, as previously, of a delay circuit of RC cell type. Circuit 6 is conventionally connected to the supply conductor, although this has not been shown either in FIG. 2 or in FIG. 3.

A feature of the present invention is that a single ESD protection control circuit 6 is enough for the entire integrated circuit. Although these control circuits are not the elements taking up most space in conventional solutions, this further helps reducing the circuit bulk. The use of several control circuits could however be maintained, for example, if the control signal access resistance needs being reduced. All control circuits are then connected in parallel to control conductor 23.

Similarly, a single control circuit 8 of protection against overvoltages is enough for the entire integrated circuit.

The price to pay for the implementation of the present invention is to add a conductor in the rail to convey control signal CTRL. However, this conductor does not need to have a large cross-section. Accordingly, the space that it takes up is small. Further, since all metallizations levels are available in the rail, it is not disturbing to assign a small section of one of the metallization levels to form this control signal. The two signals conventionally present in the rail are those which, for the implementation of the present invention, require a significant cross-section (the supply conductors).

Figure 4:
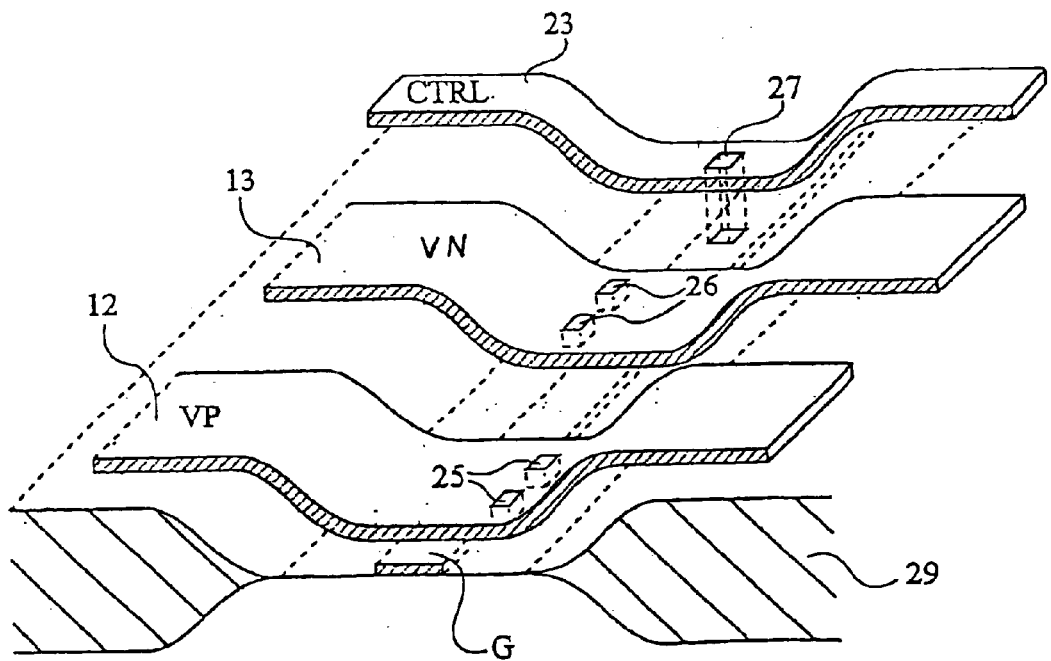
FIG. 4 is a partial perspective cross-section view illustrating a first embodiment of MOSSWI transistors associated with supply rails of an integrated circuit of the present invention.

FIG. 4 illustrates in a cross-section perspective view the forming of MOSSWI transistors according to a first embodiment of the present invention. As illustrated in this drawing, the transistors are formed perpendicularly to conductors 12 and 13 of the supply rail. This eases the connections of the drain and source (not detailed) of each transistor by contacts, and possibly vias, respectively 25 and 26 from conductors 12 and 13. Thus, in the embodiment of FIG. 4, a great number of MOS transistors of small dimension are distributed under supply rail 11. Their small size is compensated for by a considerable increase in their number and their connection in parallel, so that the desired transistor surface area to have a small series resistance is obtained.

An additional advantage of the present invention which here appears is that each pad 4 of the integrated circuit necessarily has a set of very close transistors.

In the example of FIG. 4, the connection of gate G of the transistors is performed by means of conductor 23 conveying signal CTRL laterally arranged with respect to conductors 12 and 13, that is, at the internal or external periphery of the supply rail, conversely to what is illustrated in FIG. 3. The connection of conductor 23 to gate G is performed by one or several contacts, and possibly vias 27. In FIG. 4, only thick oxide regions 29 have been symbolized on either side of gate G. The transistors may be implemented in silicon in accordance with conventional techniques.

Figure 5:
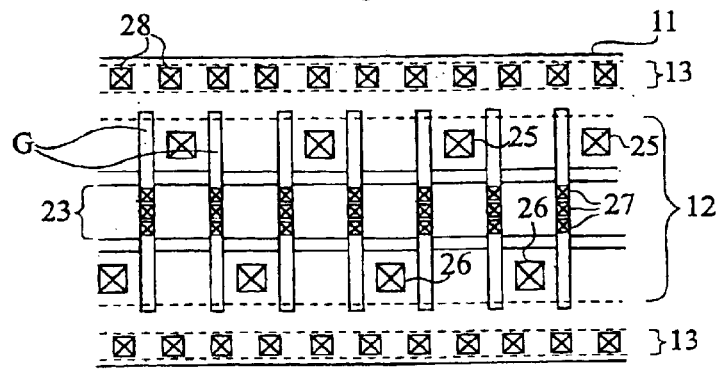
FIG. 5 illustrates in a very simplified to view a second embodiment of MOSSWI transistors associated with supply rails of an integrated circuit according to the present invention.

FIG. 5 shows in a very simplified partial top view a second embodiment of the present invention. This embodiment illustrates the case where control conductor 23 of the MOSSWI transistors is at the center of supply rail 11. In the example of FIG. 5, only rail 11 has been shown and it has, for example, a structure such that positive supply conductor 12 is surrounded with two ground conductors 13.

As in the embodiment of FIG. 4, gates G of the MOSSWI transistors are perpendicular to the conductors of supply rail 11. In the example of FIG. 5, several vias 27 for connecting gates G to conductor 23 have been shown, while a single via 25, respectively 26, for connecting the drain or the source of each transistor to the supply conductors has been shown. It should however be noted that the number of vias is to be adapted case by case according to the currents and to the application. In the example of FIG. 5, another series of vias 28 which are intended to bias the integrated circuit substrate to ground have been illustrated.

An advantage of the present invention is that the surface area taken up by the electronic protection elements (especially ESD) with respect to the core surface area intended for the application is much smaller.

Another advantage of the present invention is that the distribution of the MOSSWI transistors of the protection elements is more homogeneous than in a conventional circuit where, to minimize the surface area loss, reducing the number of protection elements may be a temptation.

Of course, the present invention is likely to have various alterations, modifications, and improvements which will readily occur to those skilled in the art. In particular, the practical implementation of the electronic protection elements (ESD or overvoltage) and more specifically the MOSSWI transistor is within the abilities of those skilled in the art according to the application and based on the functional indications given hereabove. Account will especially be taken, for the sizing of control circuit 6, of the fact that the gate capacitance of the MOSSWI transistors of the present invention is, as compared to the transistor surface area, greater than for conventional MOSSWI transistors. Further, although the forming of diodes D1, D2 of the protection circuits has not been illustrated in detail in the drawings, said diodes are, conventionally, placed outside of the rail, as close as possible to pads 4.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. An integrated circuit including at least one element of electronic protection of a circuit formed of at least one switch for short-circuiting supply conductors arranged in a rail, wherein the switch is integrated in the rail, under the conductors.

2. The circuit of claim 1, wherein several switches are controlled by at least one first common circuit.

3. The circuit of claim 2, wherein said first circuit detects the occurrence of electrostatic charges.

4. The circuit of claim 2, further including at least one second control circuit detecting the occurrence of overvoltages between said supply conductors.

5. The circuit of claim 2, wherein the control circuit of the short-circuit switches is located in a core of the integrated circuit.

6. The circuit of claim 1, wherein the switches are formed of MOS transistors having their respective drains and sources connected to one of two supply conductors of the integrated circuit.

7. The circuit of claim 6, wherein an additional conductor for controlling the gates of the MOS transistors is provided in the supply rail.

8. A method for integrating switches for short-circuiting supply conductors arranged in a rail, comprising forming the switches in the form of MOS transistors under the rail supply conductors.

9. An integrated circuit comprising:
a supply rail comprising at least two supply lines; and
at least one switch fabricated underneath the at least two supply lines,
wherein a first terminal of the at least one switch is electrically connected to one supply line of the at least two supply lines, and a second terminal of the at least one switch is electrically connected to another supply line of the at least two supply lines, the at least one switch operative to provide a short circuit between the one supply line and the other supply line.

10. The integrated circuit of claim 9, wherein the first supply line is generally maintained at a first voltage and the second supply line is generally maintained at a second voltage.

11. The integrated circuit of claim 9, wherein the at least two supply lines are conducting supply lines.

12. A method of operating an integrated circuit, the method comprising:

using a first element to detect overvoltages; and establishing a short-circuit between at least two supply lines of the integrated circuit using a second element integrated under the at least two supply lines.

13. The method of claim 12, wherein the at least two supply lines are conducting supply lines.

* * * * *

UNITED STATES PATENT AND TRADEMARK OFFICE
CERTIFICATE OF CORRECTION

PATENT NO. : 6,818,953 B2
APPLICATION NO. : 10/278434
DATED : November 16, 2004
INVENTOR(S) : Alexandre Malherbe and Fabrice Blisson It is certified that error appears in the above-identified patent and that said Letters Patent is hereby corrected as shown below:

Col. 6 lines 46-49
Claim 6 should read as shown below:

6. The circuit of claim 1, wherein the at least one switch is formed of a MOS transistor having a respective drain and source connected to one of two supply conductors of the integrated circuit.

Signed and Sealed this

Fifteenth Day of September, 2009

David J. Kappos
*Director of the United States Patent and Trademark Office*